United States Patent
Yamasaki et al.

(10) Patent No.: US 7,332,939 B2
(45) Date of Patent: Feb. 19, 2008

(54) COMPARATOR SYSTEM AND METHOD FOR COMPARING AN INPUT SIGNAL WITH A REFERENCE LEVEL USING SAID SYSTEM

(75) Inventors: Shinichi Yamasaki, Hanyu (JP); Masanori Okubayashi, Ota (JP)

(73) Assignee: Sanyo Electric Co., Ltd., Moriguchi (JP)

(*) Notice: Subject to any disclaimer, the term of this patent is extended or adjusted under 35 U.S.C. 154(b) by 0 days.

(21) Appl. No.: 10/938,873

(22) Filed: Sep. 13, 2004

(65) Prior Publication Data

US 2005/0174150 A1 Aug. 11, 2005

(30) Foreign Application Priority Data

Sep. 12, 2003 (JP) ............... 2003-320984

(51) Int. Cl.
*H03K 5/153* (2006.01)
(52) U.S. Cl. .......................... 327/77; 327/89
(58) Field of Classification Search ............... 327/77, 327/89, 98, 407
See application file for complete search history.

(56) References Cited

U.S. PATENT DOCUMENTS 3,683,284 A * 8/1972 Mueller ................. 327/70
4,418,332 A * 11/1983 Mefford ................ 340/146.2
4,912,420 A * 3/1990 Parnell ..................... 327/78
6,326,816 B1 * 12/2001 Su ........................... 327/78

FOREIGN PATENT DOCUMENTS

JP 07-240857 9/1995

* cited by examiner

*Primary Examiner*—Kenneth B. Wells
(74) *Attorney, Agent, or Firm*—Stephen B. Parker; Watchstone P+D, plc

(57) ABSTRACT

A comparator system for comparing a level of an input signal with a level of a reference signal comprises a first comparator configured to input the input signal to one of input terminals thereof and the reference signal to the other of input terminals thereof, a second comparator configured to input the reference signal to one of input terminals thereof and the input signal to the other of input terminals thereof, and a control circuit configured to input an output of the first comparator and an output of the second comparator. The control circuit selects one of the outputs of the first and second comparators quicker in level change timing, and controls an output signal of the control circuit at the level change timing of the selected output.

11 Claims, 5 Drawing Sheets

COMPARATOR SYSTEM AND METHOD FOR COMPARING AN INPUT SIGNAL WITH A REFERENCE LEVEL USING SAID SYSTEM

This application claims priority under 35 U.S.C. § 119 to Japanese Patent Application No. P2003-320984 filed on Sep. 12, 2003, the entire disclosure of which is incorporated herein by reference in its entirety.

BACKGROUND OF THE INVENTION

1. Field of the Invention

The present invention relates to a comparator system and a method for comparing an input signal with a reference voltage using the system. More specifically, the present invention relates to a comparator system and a method for comparing an input signal, such as a multiplex data signal for VPS (Video Program System) or PDC (Program Delivery Control), with a reference voltage, which can be preferably used for, for example, retrieving a data signal such as a VPS signal and a PDC signal from a multiplied broadcasting signal during the vertical blanking intervals.

2. Description of the Background

The following description sets forth the inventor's knowledge and should not be construed as an admission that the description constitutes prior art.

FIG. 7 shows a conventional comparator 101, and FIG. 8 is a timing chart showing the operation of the comparator shown in FIG. 7.

In FIG. 7, the reference numeral 101 denotes a comparator having a (+) input terminal (non-inverting input terminal) to which a vide signal S is applied, a (−) input terminal (inverting input terminal) to which a reference voltage Vref is applied, and an output terminal from which an output signal is outputted. The comparator 101 is used for comparing the video signal S applied to the (+) input terminal with the reference voltage Vref applied to the (−) input terminal.

Here, it is assumed that the video signal S shown in FIG. 8(A) is applied to the (+) input terminal of the comparator 101. In this case, for the time period during the level of the video signal S is lower than that of the reference voltage Vref, the output of the comparator 101 is a low logic level (hereinafter simply referred to as "L level"). As the time passes, the level of the video signal S rises and then reaches the same level as the reference voltage Vref at the time point of T1. After this time point of T1, the level of the video signal S becomes higher than that of the reference voltage Vref. At this moment, the output of the comparator 101 ideally changes from the L level to a high logic level (hereinafter simply referred to as "H level"). In the actual comparator 101, however, the timing of the level change of the output of the comparator 101 from the L level to the H level delays by the delay time $Td_{LH}$. Accordingly, the actual level change of the output delays by the delay time $Td_{LH}$ from the time point of T1.

On the other hand, for the time period during the level of the video signal S is higher than that of the reference voltage Vref, the output of the comparator 101 keeps the H level. As the time passes, the level of the video signal S starts to fall and then reaches the same level as the reference voltage Vref at the time point of T2. After this time point of T2, the level of the video signal S becomes lower than that of the reference voltage Vref. At this time point of T2, the output of the comparator 101 ideally changes from the H level to the L level. In the actual comparator 101, however, the timing of the level change of the output of the comparator 101 from the H level to the L level delays by the delay time $Td_{HL}$. Accordingly, the actual level change of the output delays by the delay time $Td_{HL}$ from the time point of T2.

By repeating the aforementioned operations, the level comparison between the video signal S and the reference voltage Vref will be performed, and outputs can be obtained from the comparator 101.

As mentioned above, in the actual comparator 101, at the time of changing the output level from the L level to the H level and from the H level to the L level, a delay time $Td_{LH}$ and $Td_{HL}$ occurs inevitably. Furthermore, the length of the delay time $Td_{HL}$ and $Td_{LH}$ varies depending on the operating environments such as the amplitude of the input signal wave and/or the input voltage of the comparator, or the difference in circuit structure of the comparator. Accordingly, the length of the delay time $Td_{HL}$ and $Td_{HL}$ cannot be anticipated in advance, and the sensitivity of the comparator 101 will be affected by the length of the delay time $Td_{LH}$ and $Td_{HL}$ of the output. Thus, there is a drawback that the long and uncertain delay time causes a deterioration of the accuracy of the output data and the reliability of the comparator 101.

The description herein of advantages and disadvantages of various features, embodiments, methods, and apparatus disclosed in other publications is in no way intended to limit the present invention. Indeed, certain features of the invention may be capable of overcoming certain disadvantages, while still retaining some or all of the features, embodiments, methods, and apparatus disclosed therein.

SUMMARY OF THE INVENTION

The preferred embodiments of the present invention have been developed in view of the above-mentioned and/or other problems in the related art. The preferred embodiments of the present invention can significantly improve upon existing methods and/or apparatuses.

Among other potential advantages, some embodiments can provide a comparator system high in accuracy and reliability.

Among other potential advantages, some embodiments can provide a method for comparing an input signal with a reference level with high accuracy and reliability.

According to a first aspect of a preferred embodiment of the present invention, a comparator system for comparing a level of an input signal with a level of a reference signal (reference voltage), comprises:

a first comparator configured to input the input signal to one of input terminals thereof and the reference signal to the other of input terminals thereof;

a second comparator configured to input the reference signal to one of input terminals thereof and the input signal to the other of input terminals thereof; and a control circuit configured to input an output of the first comparator and an output of the second comparator, wherein the control circuit selects one of the outputs of the first and second comparators quicker in level change timing, and controls an output signal of the control circuit at the level change timing of the selected output.

It can be constituted that the one of input terminals of the first comparator is a non-inverting input terminal and the other of input terminal of the first comparator is an inverting input terminal, and wherein the one of input terminals of the second comparator is a non-inverting input terminal and the other of input terminals of the second comparator is an inverting input terminal.

In place of the above structure, it also can be constituted that the one of input terminals of the first comparator is an inverting input terminal and the other of input terminal of the first comparator is a non-inverting input terminal, and wherein the one of input terminals of the second comparator is an inverting input terminal and the other of input terminals of the second comparator is a non-inverting input terminal.

In the aforementioned comparator system, it can be constituted that the control circuit includes a first flip-flop for normalizing the output of the first comparator, a second flip-fop for normalizing the output of the second comparator, and an output timing selection control unit for selecting one of the outputs of the first and second comparators quicker in level change timing and controlling an output signal of the control circuit at the level change timing of the selected output.

According to another aspect of a preferred embodiment of the present invention, a method of comparing an input signal with a reference level, comprises the steps of:
 receiving an input signal;
 determining a reference revel;
 applying the input signal to one of input terminals of a first comparator and to one of input terminals of a second comparator;
 applying the reference level to the other of input terminals of the first comparator and to the other of input terminals of the second comparator;
 selecting one of outputs of the first and second comparators quicker in level change timing; and
 controlling an output signal at a level change timing of the selected output.

According to still another aspect of a preferred embodiment of the present invention, a data slicer uses the aforementioned comparator system.

The above and/or other aspects, features and/or advantages of various embodiments will be further appreciated in view of the following description in conjunction with the accompanying figures. Various embodiments can include and/or exclude different aspects, features and/or advantages where applicable. In addition, various embodiments can combine one or more aspect or feature of other embodiments where applicable. The descriptions of aspects, features and/ or advantages of particular embodiments should not be construed as limiting other embodiments or the claims.

BRIEF DESCRIPTION OF THE DRAWINGS

The preferred embodiments of the present invention are shown by a way of example, and not limitation, in the accompanying figures, in which.

DETAILED DESCRIPTION OF THE
PREFERRED EMBODIMENTS

In the following paragraphs, some preferred embodiments of the invention will be described by way of example and not limitation. It should be understood based on this disclosure that various other modifications can be made by those in the art based on these illustrated embodiments.

Figure 1:
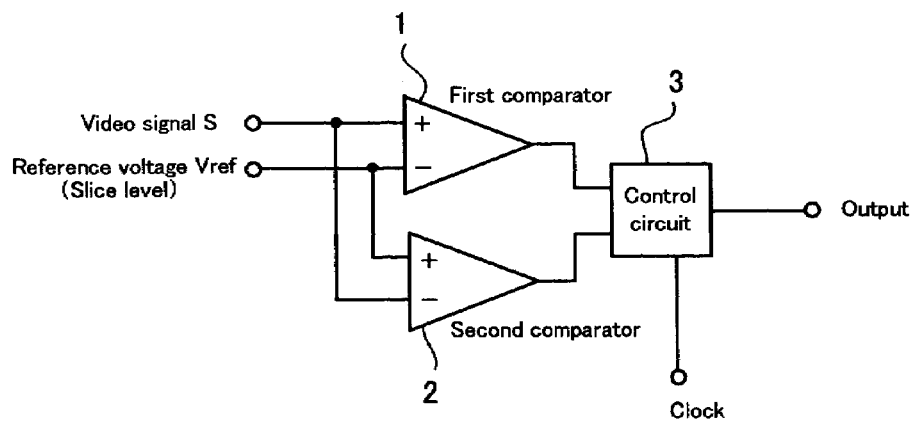
FIG. 1 is a block diagram of a comparator system showing a first embodiment of the present invention.

FIG. 1 shows an example of a block diagram of a comparator system according to a first embodiment of the invention. This comparator system includes a first comparator 1, a second comparator 2 and a control circuit 3.

The first comparator 1 is provided with a non-inverting input terminal, an inverting input terminal and an output terminal. In the first comparator 1, a video signal S is applied to the non-inverting input terminal and a reference voltage Vref as a slice level is applied to the inverting input terminal. This first comparator 1 outputs an H level signal when the level of the video signal S is higher than the level of the reference voltage Vref, and outputs an L level signal when the level of the video signal S is lower than the level of the reference voltage Vref.

The second comparator 2 is provided with a non-inverting input terminal, an inverting input terminal and an output terminal like the first comparator 1. The non-inverting input terminal of this second comparator 2 is connected to the inverting input terminal of the first comparator 1, and the inverting input terminal thereof is connected to the non-inverting input terminal of the first comparator 1. Accordingly, applied to the non-inverting input terminal of the first comparator 1, the video signal S is simultaneously applied to the inverting input terminal of the second comparator 2. Similarly, applied to the inverting input terminal of the first comparator 1, the reference voltage Vref as a slice level is simultaneously applied to the non-inverting input terminal of the second comparator 2. This second comparator 2 outputs an L level signal D when the level of the video signal S is higher than the level of the reference voltage Vref, and outputs an H level signal when the level of the video signal S is lower than the level of the reference voltage Vref.

The control circuit 3 is provided with a first input terminal, a second input terminal, a clock input terminal and an output terminal. The first input terminal is connected to the output terminal of the first comparator 1 and the second input terminal is connected to the output terminal of the second comparator 2. Applied to the dock input terminal is a clock signal. This control circuit 3 is configured to compare the length of the delay time occurred at the time of the level change of the output signal of the first comparator 1 with the length of the delay time occurred at the time of the level change of the output signal of the second comparator 2 and select one of the output signals with a shorter delay time, i.e., one of the output signals with a quicker level change, between the output signals from the comparators 1 and 2, to thereby control the output of the comparator system.

Figure 2:
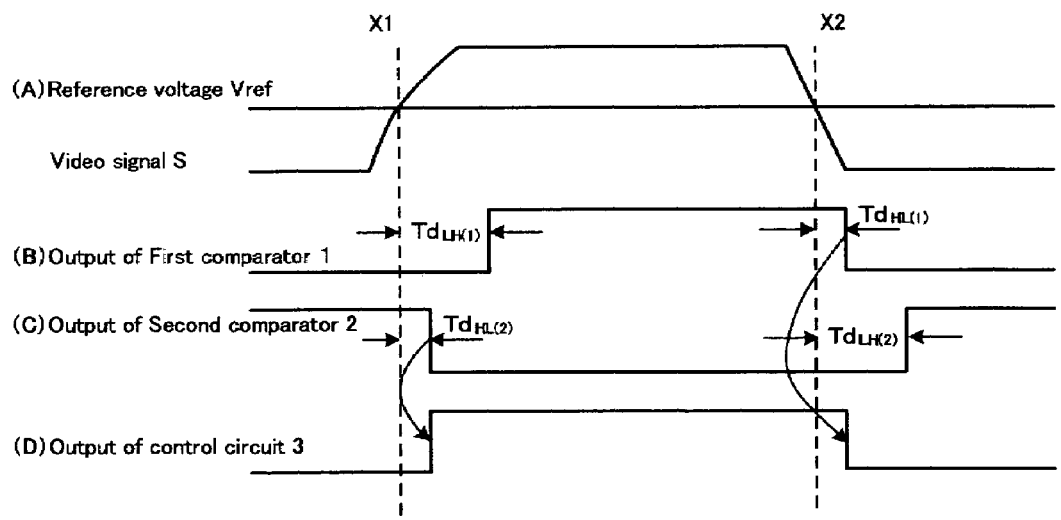
FIG. 2 is a timing chart showing the operation of the comparator system shown in FIG. 1.

In the following explanation, it is assumed that a video signal S and a reference voltage Vref as shown in the timing chart of FIG. 2(A) are applied to the first and second comparators 1 and 2. In FIG. 2, "X1" denotes a first timing point when the level of the video signal S becomes the same level of the reference voltage Vref, and "X2" denotes a second timing point when the level of the video signal S becomes the same level of the reference voltage Vref.

As the video signal S changes with the reference voltage Vref constant as shown in FIG. 2(A), in this embodiment, the output of the first comparator 1 changes as shown in FIG. 2(B), while the output of the second comparator 2 changes as shown in FIG. 2(C).

In the first comparator 1, for the time period during the level of the video signal S is lower than that of the reference voltage Vref, the output of the comparator 1 is an L level. As the time passes, the level of the image signal S rises and then reaches the same level as the reference voltage Vref at the first timing point of X1. After this first timing point of X1, the level of the video signal S becomes higher than that of the reference voltage Vref (hereinafter this level change will be referred to as "first level change"). At this first timing point X1, the output of the comparator 1 does not change from the L level to the H level. In this first comparator 1, the timing of the level change of the output from the L level to the H level delays by the delay time $Td_{LH(1)}$ as shown in FIG. 2(B). Accordingly, the actual level change of the output delays by the delay time $Td_{LH(1)}$ from the first timing point of X1.

For the time period during the level of the video signal S is kept higher than that of the reference voltage Vref, the output of the comparator 1 keeps the H level.

As the time passes, the level of the image signal S starts to fall and then reaches the same level as the reference voltage Vref at the second timing point of X2. After this second timing point of X2, the level of the video signal S becomes lower than that of the reference voltage Vref (hereinafter this level change will be referred to as "second level change"). At this second timing point X2, the output of the comparator 1 does not change from the H level to the L level. In this comparator 1, the timing of the level change of the output from the H level to the L level delays by the delay time $Td_{HL(1)}$ as shown in FIG. 2(B). Accordingly, the actual level change of the output delays by the delay time $Td_{HL(1)}$ from the second timing point of X2.

On the other hand, in the second comparator 2, for the time period during the level of the video signal S is lower than that of the reference voltage Vref, the output of the comparator 2 is an H level. As the time passes, the level of the image signal S rises and then reaches the same level as the reference voltage Vref at the first timing point of X1. After this first timing point of X1, the level of the video signal S becomes higher than that of the reference voltage Vref. At this first timing point X1, the output of the second comparator 2 does not change from the H level to an L level. In this comparator 2, the timing of the level change of the output from the H level to the L level delays by the delay time $Td_{HL(2)}$ as shown in FIG. 2(C). Accordingly, the actual level change of the output delays by the delay time $Td_{HL(2)}$ from the timing point of X1.

For the time period during the level of the video signal S is kept higher than that of the reference voltage Vref, the output of the second comparator 2 keeps the L level.

As the time passes, the level of the image signal S starts to fall and then reaches the same level as the reference voltage Vref at the second timing point of X2. After this second timing point of X2, the level of the video signal S becomes lower than that of the reference voltage Vref. At this second timing point X2, the output of the second comparator 2 does not change from the L level to the H level. In this second comparator 2, the timing of the level change of the output from the L level to the H level delays by the delay time $Td_{LH(2)}$ as shown in FIG. 2(C). Accordingly, the actual level change of the output delays by the delay time $Td_{LH(2)}$ from the second timing point of X2.

When the delay time $Td_{LH(1)}$ of the output of the first comparator 1 occurred at the first level change of the video signal S is compared with the delay time $Td_{HL(2)}$ of the output of the second comparator 2 occurred at the first level change of the video signal S, the latter delay time $Td_{HL(2)}$ is shorter than the former delay time $Td_{LH(1)}$. Therefore, the control circuit 3 selects the output of the second comparator 2 with the shorter delay time $Td_{HL(2)}$, and controls the output of the control circuit 3 at the timing the shorter delay time $Td_{HL(2)}$ has passed from the first timing point X1 as shown in FIG. 2(D).

Similarly, when the delay time $Td_{HL(1)}$ of the output of the first comparator 1 occurred at the second level change of the video signal S is compared with the delay time $Td_{HL(2)}$ of the output of the second comparator 2 occurred at the second level change of the video signal S, the former delay time $Td_{HL(1)}$ is shorter than the latter delay time $Td_{LH(2)}$. Therefore, the control circuit 3 selects the output of the first comparator 1 with the shorter delay time $Td_{HL(1)}$, and controls the output of the control circuit 3 at the timing the shorter delay time $Td_{HL(1)}$ has passed from the second timing point X2 as shown in FIG. 2(D).

As will be understood from the above explanation, the output of the control circuit 3 always changes in accordance with the selected output of the first or second comparator 1 or 2 with the shorter time delay.

Figure 3:
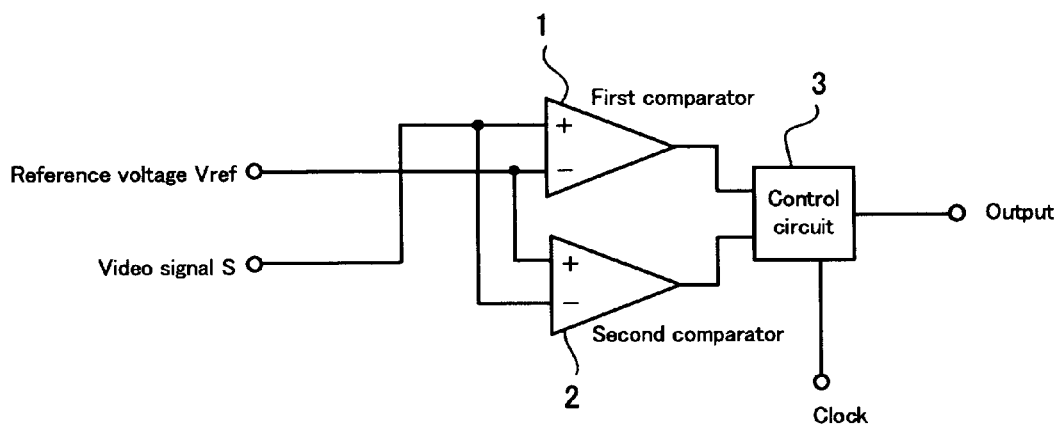
FIG. 3 is a comparator system showing a second embodiment of the present invention.
Figure 4:
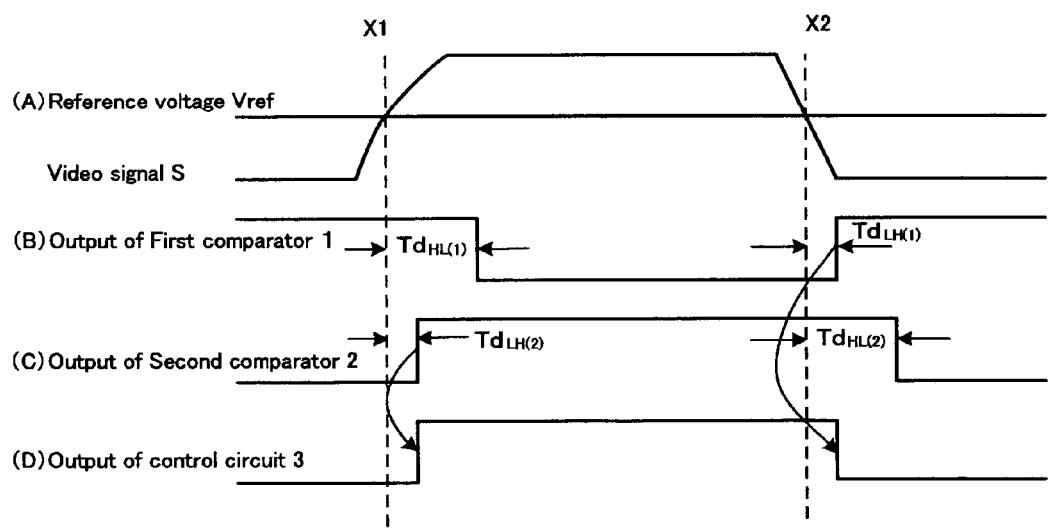
FIG. 4 is a timing chart showing the operation of the comparator system shown in FIG. 1.

FIG. 3 shows a modified embodiment according to the present invention. This embodiment is different from the first embodiment in that the video signal S is applied to the inverting input terminal of the first comparator 1 and the non-inverting input terminal of the second comparator 2 and that the reference voltage Vref is applied to the non-inverting input terminal of the first comparator 1 and the inverting input terminal of the second comparator 2. Since the remaining structures are the same as those of the first embodiment, the detail explanation thereof will be omitted by allotting the same reference numeral to the corresponding portion. The timing chart of this embodiment is shown in FIG. 4.

In this embodiment, at the first level change of the video signal S, in the same manner as in the first embodiment, since the delay time $Td_{LH(2)}$ is shorter than the delay time $Td_{HL(1)}$ (see FIG. 4(B) and FIG. 4(C)), the control circuit 3 selects the output of the second comparator 2 with the shorter delay time $Td_{LH(2)}$, and controls the output of the control circuit 3 at the timing the shorter delay time $Td_{LH(2)}$ has passed from the first timing point X1 as shown in FIG. 4(D). On the other hand, at the second level change of the video signal S, in the same manner as in the first embodiment, since the delay time $Td_{LH(1)}$ is shorter than the delay time $Td_{HL(2)}$. The control circuit 3 selects the output of the first comparator 1 with the shorter delay time $Td_{LH(1)}$, and controls the output of the control circuit 3 at the timing the shorter delay time $Td_{LH(1)}$ has passed from the second timing point X2 as shown in FIG. 2(D).

As will be understood from the above explanation, in this second embodiment too, the output of the control circuit 3 always changes in accordance with the selected output of the first or second comparator 1 or 2 with the shorter time delay.

Figure 5:
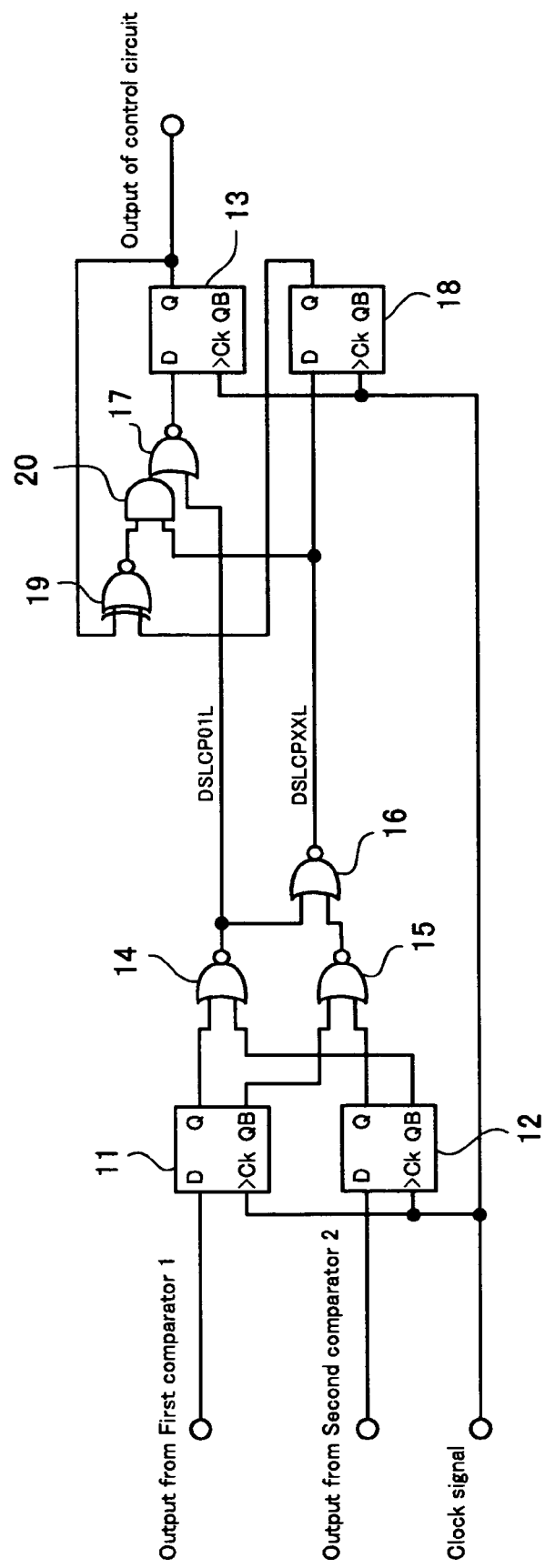
FIG. 5 is a circuit showing an example of the control circuit employed in the comparator system shown in FIGS. 1 and 3.

FIG. 5 shows an example of the control circuit 3 shown in FIG. 1 and FIG. 3. In FIG. 5 reference numeral "11" denotes a first D-type flip-flop which is configured to input the output of the first comparator 1 and then output a non-inverted output and an inverted output after the normalization with a clock signal. "12" denotes a second D-type flip-flop which is configured to input the output of the second comparator 2 and then output a non-inverted output and an inverted output after the normalization with the dock signal. "13" denotes a third D-type flip-flop which is configured to input an output of a NOR gate 17 and output a non-inverted output after the normalization with the dock signal. The output of this flip-flop 13 becomes an output of the control circuit 3. "14" denotes a NOR gate which is configured to input the non-inverted output of the first flip-flop 11 and the inverted output of the second flip-flop 12. "15" denotes a NOR gate which is configured to input the inverted output of the first flip-flop 11 and the non-inverted output of the second flip-flop 12. "16" denotes a NOR gate which is configured to input the output signal of the NOR gate 14 and the output signal of the NOR gate 15. "18" denotes a fourth D-type flip-flop which is configured to input the output signal of the NOR gate 16 and output a non-inverted output. "19" denotes an exclusive NOR gate which is configured to input a feedback signal of the output of the third D-type flip-flop 13 and the output signal of the NOR gate 16 through the fourth flip-flop 18. "20" denotes an AND gate which is configured to input the output signal of the exclusive NOR gate 19 and the output signal of the NOR gate 16. The aforementioned NOR gate 17 is configured to input the output signal of the AND gate 20 and the output signal of the NOR gate 14 and output the output signal which is to be applied to the third D-type flip-flop 13.

Figure 6:
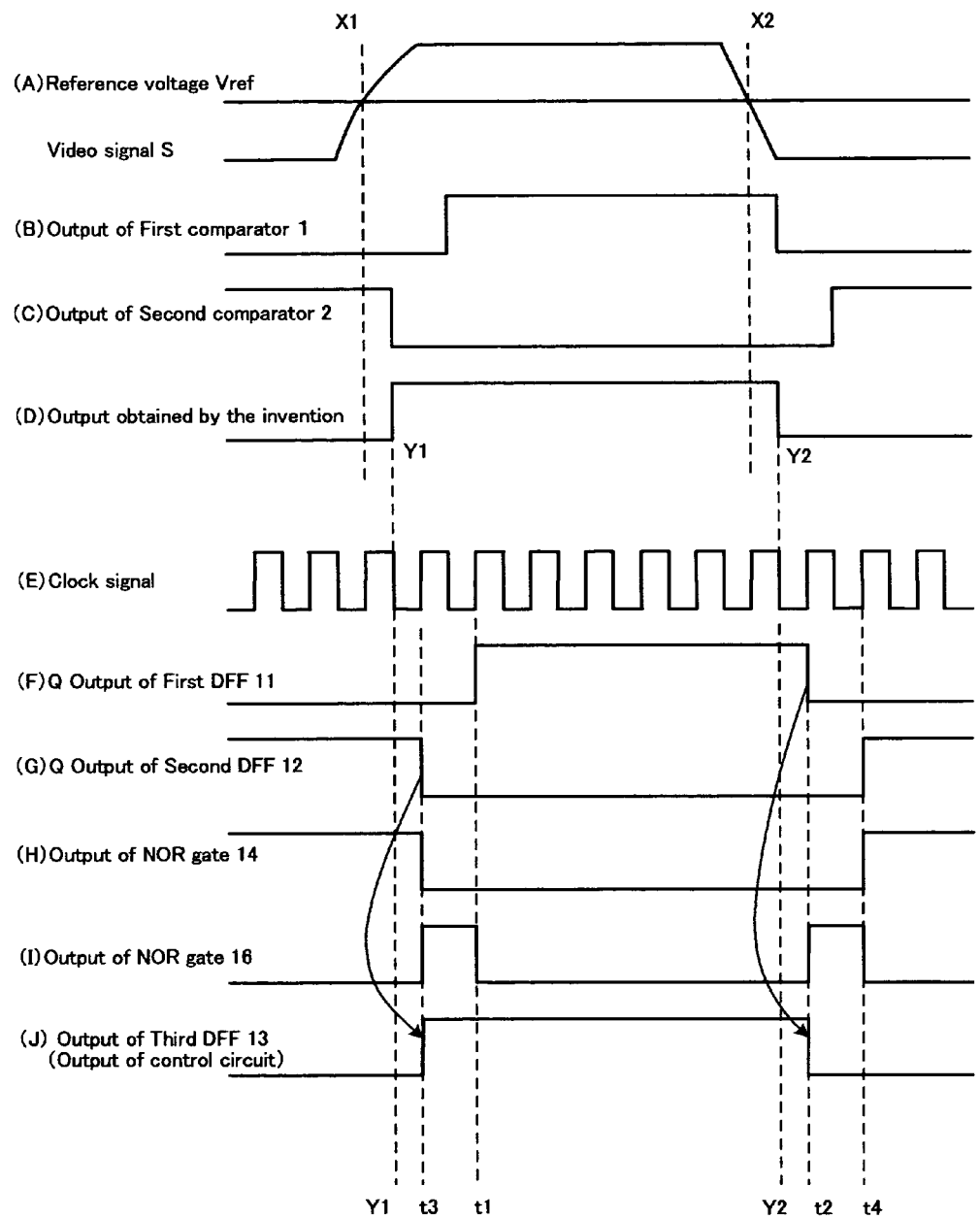
FIG. 6 is a timing chart showing the operation of the control circuit shown in FIG. 5.
Figure 7:
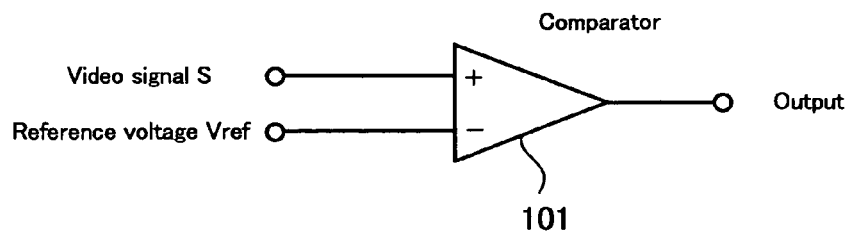
FIG. 7 shows a conventional comparator.
Figure 8:
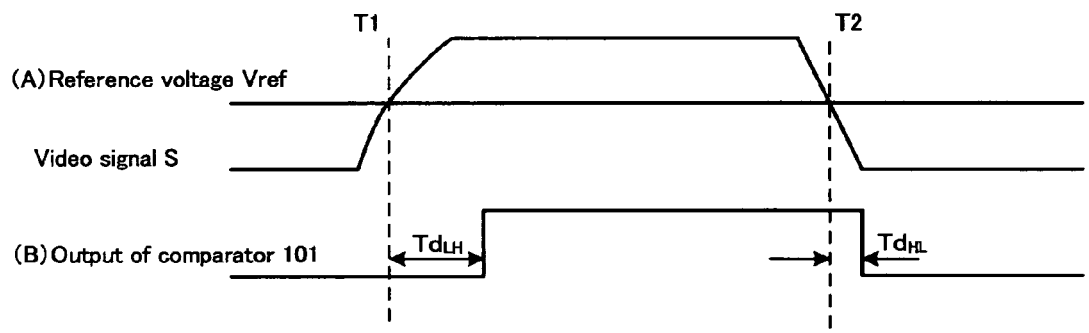
FIG. 8 is a timing chart showing the operation of the comparator shown in FIG. 7.

The operation of this control circuit 3 shown in FIG. 5 will be explained with reference to the timing chart shown in FIG. 6.

In the following explanation, it is assumed that the reference voltage Vref and the video signal S as shown in FIG. 6(A) are applied to the comparator system shown in FIG. 1. As explained above, the output of the first comparator 1, the output of the second comparator 2 and the output of the control circuit 3, i.e., the output of the comparator system, become as shown in FIG. 6(B), FIG. 6(C) and FIG. 6(D), respectively. The outputs of the control circuit 3 changes from the L level to the H level at the first timing point of Y1 and from the H level to the L level at the second timing point of Y2. FIG. 6(E) shows the dock signal which is to be applied to the flip-flops 11, 12, 13 and 18. FIG. 6(F) shows an non-inverted output of the first D-type flip-flop 11 normalized with the dock signal, and FIG. 6(G) shows a non-inverted output of the second D-type flip-flop 12 normalized with the dock signal. The output of the first D-type flip-flop 11 changes from the L level to the H level at the timing pint of to and from the H level t the L level at the timing point of t2. Similarly, the output of the second D-type flip-flop 12 changes from the H level to the L level at the timing point of t3 and from the L level to the H level at the timing point of t4.

The output of the NOR gate 14 becomes an H level when the non-inverted output of the first D-type flip-flop 11 is an L level and the non-inverted output of the second D-type flip-flop 12 is an H level. In other words, the level of the output signal of the NOR gate 14 takes the H level before the timing point of t3 and after the timing point of t4 as shown in FIG. 6(H).

The output of the NOR gate 16 becomes an H level when the non-inverted output of the first D-type flip-flop 11 and the non-inverted output of the second D-type flip-flop 12 take the same level, i.e., both the non-inverted outputs of the first and second flip-flops are the H level or the L level. Accordingly, the output of the NOR gate 16 only takes the H level between the timing points of t3 and t1 and between the timing points of t2 and t4 as shown in FIG. 6(I).

The output of the NOR gate 16 is applied to the exclusive NOR gate 19 via the D-type flip-flop 18. When the output of the NOR gate 16 becomes an H level, at the rising timing point of the output, the output of the third D-type flip-flop 13 will be inverted. In detail, at the timing points of t3 and t2, the output of the third D-type flip-flop 13 changes as shown in FIG. 6(J). The obtained output of the third D-type flip-flop 13 is an output of the control circuit 3, and therefore the output of the control circuit 3 changes as shown in FIG. 6(J).

At the first level change of the video signal S as shown in FIG. 6(A), the control circuit 3 selects the shorter timing point of t3 (<t1) shorter than the timing point of t1 in delay time from the timing point of Y1. At the second level change of the video signal, the control circuit 3 selects the shorter timing point of t2 (<t4) shorter than the timing point of t4 in delay time from the timing point of Y2. As a result, the output of the control circuit 3 changes as shown in FIG. 6(J).

In this timing chart, when the wave form shown in FIG. 6(J) is compared with that shown in FIG. 6(D), the delay time from the first timing point of Y1 is short and the delay time from the second timing point of Y2 is also short. Furthermore, the time when the first level change occurred is dosed to the time when the second level change occurred. In detail, the delay time of the output of the control circuit 3 is [Y1+t3] at the first level change and [Y2+t2] at the second level change. In the control circuit 3 of this embodiment, each delay time is caused by the normalization with the dock signal of the output of each comparator 1 or 2.

In the output obtained by normalizing the output of the first comparator 1 with the dock as shown in FIG. 6(E), i.e., the output of the first D-type flip-flop 11, the delay time at the first level change can be expressed as [Y1+t1], and the delay time at the second level change can be expressed as [Y2+t2]. Accordingly, in the wave form of the normalized output of the first comparator 1, although the delay time from the second timing point of Y2 at the second level change is the same as the delay time from the second timing point of X2 shown in FIG. 6(D), the delay time from the first timing point of Y1 at the first level change is longer than the delay time from the first timing point of X1 shown in FIG. 6(D) by the delay time [t1–t3]. Furthermore, in the output obtained by normalizing the output of the second comparator 2 with the clock signal as shown in FIG. 6(G), i.e., the output of the second D-type flip-flop 12, the delay time at the first level change can be represented by [Y1+t3], and the delay time at the second level change can be represented by [Y2+t4]. Accordingly, in the wave form of the normalized output of the second comparator 2, although the delay time from the first timing point of Y1 at the first level change is the same as the delay time from the first timing point of X1 shown in FIG. 6(D), the delay time from the second timing point of Y2 at the second level change is longer than the delay time from the second timing point of X2 shown in FIG. 6(D) by the delay time [t4–t2]. Furthermore, regarding the time [Y1~Y2] between the first timing point of Y1 and the second timing point of Y2, there are large data spread in the time from the first level change from the second level change due to the influence of the delay time at the time of the level change, such that although the time [Y1~Y2] in the wave form of the output of the control circuit 3 shown in FIG. 6(J) is almost the same as the time [Y1~Y2] shown in FIG. 6(D), the time [Y1~Y2] in the wave form of the normalized output of the first comparator 1 shown in FIG. 6(F) is too short, and the time [Y1~Y2] in the wave form of the normalized output of the second comparator 2 shown in FIG. 6(G) is too long.

As mentioned above, in the control circuit 3, the output of the first comparator 1 and the output of the second comparator 2 are normalized by the first D-type flip-flop 11 and the second D-type flip-flop 12, respectively, one of the normalized outputs shorter in delay time at the first level change is selected and one of the normalized outputs shorter in delay time at the second level change is selected, and then the output of the control circuit 3 is controlled so as to be changed at the timing shorter in delay time. Accordingly, the delay time of the comparator occurred at the level change of the video signal S can be shortened, which enables the spread data of the time from the first level change to the second level change to be decreased. This in turn can enhance the accuracy of the data to be outputted from the control circuit 3 and also can enhance the reliability as a comparator system.

In the aforementioned embodiments, in the delay time of the output of the two comparators 1 and 2 from the timing point of X1 and X2 in which the video signal S and the reference voltage Vref take the same level, the above explanation was directed to the case in which the delay at the time of rising the video signal level is longer than the delay at the time of falling the video signal level. However, the present invention is not limited to the above, and can be applied regardless of the length of the delay time at the time of rising/falling the video signal level.

While the present invention may be embodied in many different forms, a number of illustrative embodiments are described herein with the understanding that the present disclosure is to be considered as providing examples of the principles of the invention and such examples are not intended to limit the invention to preferred embodiments described herein and/or illustrated herein.

Broad Scope of the Invention:

While illustrative embodiments of the invention have been described herein, the present invention is not limited to the various preferred embodiments described herein, but includes any and all embodiments having equivalent elements, modifications, omissions, combinations (e.g., of aspects across various embodiments), adaptations and/or alterations as would be appreciated by those in the art based on the present disclosure. The limitations in the claims are to be interpreted broadly based on the language employed in the claims and not limited to examples described in the present specification or during the prosecution of the application, which examples are to be construed as non-exclusive. For example, in the present disclosure, the term "preferably" is non-exclusive and means "preferably, but not limited to." In this disclosure and during the prosecution of this application, means-plus-function or step-plus-function limitations will only be employed where for a specific claim limitation all of the following conditions are present in that limitation: a) "means for" or "step for" is expressly recited; b) a corresponding function is expressly recited; and c) structure, material or acts that support that structure are not recited. In this disclosure and during the prosecution of this application, the terminology "present invention" or "invention" may be used as a reference to one or more aspect within the present disclosure. The language present invention or invention should not be improperly interpreted as an identification of criticality, should not be improperly interpreted as applying across all aspects or embodiments (i.e., it should be understood that the present invention has a number of aspects and embodiments), and should not be improperly interpreted as limiting the scope of the application or claims. In this disclosure and during the prosecution of this application, the terminology "embodiment" can be used to describe any aspect, feature, process or step, any combination thereof, and/or any portion thereof, etc. In some examples, various embodiments may include overlapping features. In this disclosure and during the prosecution of this case, the following abbreviated terminology may be employed: "e.g." which means "for example;" and "NB" which means "note well."

What is claimed is:

1. A comparator system for comparing a level of an input signal with a level of a reference signal, comprising:
   a first comparator configured to input the input signal to one of input terminals thereof and the reference signal to the other of input terminals thereof;
   a second comparator configured to input the reference signal to one of input terminals thereof and the input signal to the other of input terminals thereof; and
   a control circuit configured to input an output of the first comparator and an output of the second comparator,
   wherein a non-inverting terminal of said first comparator is connected to an inverting terminal of said second comparator and an inverting terminal of said first comparator is connected to a non-inverting terminal of said second comparator, and
   wherein said control circuit includes a first flip-flop for normalizing the output of said first comparator, a second flip-flop for normalizing the output of said second comparator, and an output timing selection control unit configured to select one of the normalized outputs of said first and second flip-flops that is quicker in level change timing than the other, whereby an output of said control circuit changes logic state in response to a signal level change of either the output of said first comparator or the output of said second comparator, whichever occurs first after a crossing of said input signal above or below said reference signal.

2. The comparator system as recited in claim 1, wherein the one of input terminals of the first comparator is a non-inverting input terminal and the other of input terminal of the first comparator is an inverting input terminal, and wherein the one of input terminals of the second comparator is a non-inverting input terminal and the other of input terminal of the second comparator is an inverting input terminal.

3. The comparator system as recited in claim 1, wherein the one of input terminals of the first comparator is an inverting input terminal and the other of input terminal of the first comparator is a non-inverting input terminal, and wherein the one of input terminals of the second comparator is an inverting input terminal and the other of input terminal of the second comparator is a non-inverting input terminal.

4. A data slicer using the comparator system as recited in claim 1.

5. The data slicer as recited in claim 4, wherein the one of input terminals of the first comparator is a non-inverting input terminal and the other of input terminal of the first comparator is an inverting input terminal, and wherein the one of input terminals of the second comparator is a non-inverting input terminal and the other of input terminal of the second comparator is an inverting input terminal.

6. The data slicer as recited in claim 4, wherein the one of input terminals of the first comparator is an inverting input terminal and the other of input terminal of the first comparator is a non-inverting input terminal, and wherein the one of input terminals of the second comparator is an inverting input terminal and the other of input terminal of the second comparator is a non-inverting input terminal.

7. The comparator system as recited in claim 1, wherein said first and second comparators are the same type.

8. A method of comparing an input signal with a reference level, the method comprising the steps of:
   receiving an input signal;

determining a reference level signal;

applying the input signal to one of at least two input terminals of a first comparator and to one of at least two input terminals of a second comparator in a state in which a non-inverting terminal of said first comparator is connected to an inverting terminal of said second comparator and an inverting terminal of said first comparator is connected to a non-inverting terminal of said second comparator;

applying the reference level signal to the other of said at least two input terminals of the first comparator and to the other of said at least two input terminals of the second comparator in said state;

inputting an output of said first comparator and an output of said second comparator to a control circuit, said control circuit including a first flip-flop for normalizing the output of said first comparator, a second flip-flop for normalizing the output of said second comparator, and an output timing selection control unit configured to select one of the normalized outputs of said first and second flip-flops that is quicker in level change timing than the other; whereby changing a logic state of an output of the control circuit changes in response to a signal level change of either the output of said first comparator or the output of said second comparator, whichever occurs first after a crossing of said input signal above or below said reference level signal.

9. The method as recited in claim 8, wherein the one of input terminals of the first comparator is a non-inverting input terminal and the other of input terminal of the first comparator is an inverting input terminal, and wherein the one of input terminals of the second comparator is a non-inverting input terminal and the other of input terminal of the second comparator is an inverting input terminal.

10. The method as recited in claim 8, wherein the one of input terminals of the first comparator is an inverting input terminal and the other of input terminal of the first comparator is a non-inverting input terminal, and wherein the one of input terminals of the second comparator is an inverting input terminal and the other of input terminal of the second comparator is a non-inverting input terminal.

11. The method as recited in claim 8, including providing said first and second comparators as the same type.

* * * * *